(12) United States Patent
Yang

(10) Patent No.: US 11,411,053 B2
(45) Date of Patent: Aug. 9, 2022

(54) COLOR FILTER STRUCTURE DOPED WITH NANOPARTICLE AND OLED DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Hanning Yang, Wuhan (CN)

( * ) Notice: Subject to any disclaimer, the term of this patent is extended or adjusted under 35 U.S.C. 154(b) by 167 days.

(21) Appl. No.: 16/965,623

(22) PCT Filed: Mar. 17, 2020

(86) PCT No.: PCT/CN2020/079566
§ 371 (c)(1),
(2) Date: Jul. 29, 2020

(87) PCT Pub. No.: WO2021/128605
PCT Pub. Date: Jul. 1, 2021

(65) Prior Publication Data
US 2021/0202586 A1    Jul. 1, 2021

(30) Foreign Application Priority Data
Dec. 25, 2019    (CN) .......................... 201911352402.7

(51) Int. Cl.
*H01L 27/32* (2006.01)
*H01L 51/52* (2006.01)

(52) U.S. Cl.
CPC ........ *H01L 27/322* (2013.01); *H01L 51/5237* (2013.01); *H01L 51/5284* (2013.01)

(58) Field of Classification Search
None
See application file for complete search history.

(56) References Cited

U.S. PATENT DOCUMENTS

| 2009/0278450 A1* | 11/2009 | Sonoyama ............ H01L 27/322 313/504 |
| 2010/0132770 A1 | 6/2010 | Beatty et al. |
| 2010/0134520 A1 | 6/2010 | Coe-Sullivan et al. |
| 2016/0202400 A1* | 7/2016 | Lee ........................ G02B 5/206 257/40 |
| 2018/0100956 A1 | 4/2018 | Lee et al. |
| 2018/0374904 A1 | 12/2018 | Xu |

(Continued)

FOREIGN PATENT DOCUMENTS

| CN | 1598662 A | 3/2005 |
| CN | 1786753 A | 6/2006 |
| CN | 103972262 A | 8/2014 |

(Continued)

*Primary Examiner* — Nduka E Ojeh

(57) ABSTRACT

The invention provides a color filter structure and an OLED display panel. The color filter structure includes a base layer, a color filter, a black matrix, a protective film, and a transparent conductive film, wherein the color filter includes nanoparticles. The OLED display panel includes a base substrate, a TFT structure, a color resistor retaining wall, a light-emitting layer, a pixel definition layer, a black retaining wall, a cathode layer, the color filter structure, and an encapsulation layer, wherein a height of the color filter structure is slightly lower than or equal to a height of the black retaining wall.

5 Claims, 2 Drawing Sheets

(56) References Cited

U.S. PATENT DOCUMENTS

2020/0194504 A1* 6/2020 Xu ........................ H01L 27/322

FOREIGN PATENT DOCUMENTS

| CN | 107482126 | A | 12/2017 |
| CN | 107918223 | A | 4/2018 |
| CN | 108957836 | A | 12/2018 |
| CN | 110323241 | A | 10/2019 |
| WO | 2007092606 | A2 | 8/2007 |

* cited by examiner

COLOR FILTER STRUCTURE DOPED WITH NANOPARTICLE AND OLED DISPLAY PANEL

BACKGROUND OF INVENTION

Field of Invention

The present invention relates to a field of display technology, and in particular, to a color filter structure and an OLED display panel.

Description of Prior Art

Display panels, such as organic light-emitting diodes (OLEDs) have received great attention from academics and industry because of their huge development potential in solid-state lighting and tablet displays. With the development of science and technology and the increase of people's requirements for products, flexible displays have become a field of increasing concern.

At present, reducing a thickness of a screen to achieve foldability of the screen has become the development trend of screens of future mobile phones. For the current OLED display, a polarizer is composed of a $\lambda/4$ phase retarder and a linear polarizer, which can effectively eliminate the reflected light generated by external light irradiating on the display surface. However, its phase retardation capability usually cannot meet the anti-reflection requirements of all visible light, and thus the reflection cannot reach zero. Thicknesses of traditional polarizers are generally in a range small than 100 μm, which limits the thickness of the screen and reduces the bending performance of the screen.

In view of above, in order to meet the current screen development, there is a need to propose a thinned polarizer with lower reflection. In addition, since the bending performance of the screen is enhanced, the screen is required to have a larger viewing angle. The present invention proposes a novel polarizer structure, which can reduce the thickness of traditional polarizers, and achieve the effects of anti-reflection of the traditional polarizers and expansion of the viewing angle of the display screen.

SUMMARY OF INVENTION

The present invention proposes a novel polarizer structure, which can reduce the thickness of traditional polarizers, and achieve the effects of anti-reflection of the traditional polarizers and expansion of the viewing angle of the display screen.

To solve the above problems, the technical solution provided by the present invention is as follows:

An embodiment of the present invention provides a color filter structure. The color filter structure includes:

a base layer;

color filters disposed above the base layer, and including a red filter, a green filter, and a blue filter;

a black matrix disposed between the red filter, the green filter, and the blue filter, and having a height lower than the color filters;

a protective film disposed above the color filters and the black matrix; and a transparent conductive film disposed above the protective film, wherein the red filter, the green filter, and the blue filter are respectively provided with red nanoparticles, green nanoparticles and blue nanoparticles therein;

the color filter structure has a thickness less than or equal to 20 microns; and the red nanoparticles, the green nanoparticles, and the blue nanoparticles are metal nanoparticles which include gold nanoparticles or silver nanoparticles.

According to the color filter structure provided by an embodiment of the present invention, each of the red nanoparticles, the green nanoparticles, and the blue nanoparticles has a size between 5 nanometers and 100 nanometers.

According to the color filter structure provided by an embodiment of the present invention, each of the red nanoparticles, the green nanoparticles, and the blue nanoparticles includes a shape of a sphere, a cube, or a plate.

Another embodiment of the present invention provides another color filter structure. The color filter structure includes:

a base layer;

color filters disposed above the base layer, and including a red filter, a green filter, and a blue filter;

a black matrix disposed between the red filter, the green filter, and the blue filter, and having a height lower than the color filter;

a protective film disposed above the color filters and the black matrix; and a transparent conductive film disposed above the protective film, wherein the red filter, the green filter, and the blue filter are respectively provided with red nanoparticles, green nanoparticles and blue nanoparticles therein; and the color filter structure has a thickness less than or equal to 20 microns.

According to the color filter structure provided by an embodiment of the present invention, each of the red nanoparticles, the green nanoparticles, and the blue nanoparticles has a size between 5 nanometers and 100 nanometers.

According to the color filter structure provided by an embodiment of the present invention, each of the red nanoparticles, the green nanoparticles, and the blue nanoparticles includes a shape of a sphere, a cube, or a plate.

According to the color filter structure provided by an embodiment of the present invention, the red nanoparticles, the green nanoparticles, and the blue nanoparticles are metal nanoparticles.

According to the color filter structure provided by an embodiment of the present invention, the metal nanoparticles include gold nanoparticles or silver nanoparticles.

Still another embodiment of the present invention provides an OLED display panel including a base substrate, a TFT structure disposed above the base substrate, and a color resistor retaining wall, a light-emitting layer, a pixel definition layer, a black retaining wall, a cathode layer, the color filter structure, and an encapsulation layer which are disposed on the TFT structure, wherein the black retaining wall is disposed on the color resistor retaining wall and the pixel definition layer, the cathode layer covers the color resistor retaining wall, the black retaining wall, the light-emitting layer, and the pixel definition layer, the color filter structure is disposed on the cathode layer, and the encapsulation layer covers the cathode and the color filter structure;

wherein, the color filter structure includes: a base layer; color filters disposed above the base layer, and including a red filter, a green filter, and a blue filter; a black matrix disposed between the red filter, the green filter, and the blue filter, and having a height lower than the color filter; a protective film disposed above the color filters and the black matrix; and a transparent conductive film disposed above the protective film, wherein the red filter, the green filter, and the blue filter are respectively provided with red nanoparticles, green nanoparticles and blue nanoparticles therein; and the color filter structure has a thickness less than or equal to 20 microns; and wherein a height of the color filter structure is slightly lower than or equal to a height of the black retaining wall.

According to the OLED display panel provided by an embodiment of the present invention, the color filters include a red filter, a green filter, and a blue filter respectively disposed on a red sub-pixel, a green sub-pixel, and a blue sub-pixel.

According to the OLED display panel provided by an embodiment of the present invention, a height of the black retaining wall is not more than 20 microns.

According to the OLED display panel provided by an embodiment of the present invention, shapes, sizes, and materials of the red nanoparticles, the green nanoparticles, and the blue nanoparticles in the color filters are different from each other.

According to the OLED display panel provided by an embodiment of the present invention, the red nanoparticles, the green nanoparticles, and the blue nanoparticles in the color filters are nanoparticles having an absorption wavelength of 380 nm to 780 nm.

The color filter structure provided by the present invention is doped with nanoparticles, and after the light emitted from the light-emitting layer is scattered by the nanoparticles in the color filter, the light emitted from the light emitting layer can be scattered into the entire space due to the randomness of the scattering direction. The present invention also provides an OLED panel, which uses the color filter provided by the present invention, thereby reducing the thickness of traditional polarizers, and achieving the effects of anti-reflection of the traditional polarizers and expansion of the viewing angle of the display screen.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
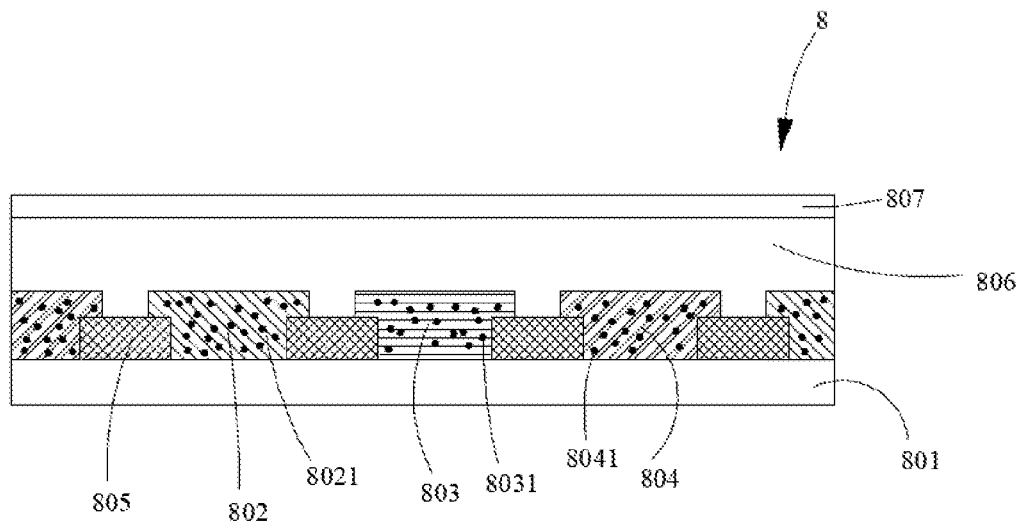
FIG. 1 is a schematic diagram of a color filter structure provided by an embodiment of the present invention.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In the description of this application, it should be understood that the terms "center", "longitudinal", "transverse", "length", "width", "thickness", "upper", "lower", "front", "Rear", "left", "right", "vertical", "horizontal", "top", "base layer", "inside", "outside", "clockwise", "counterclockwise", and the like are based on the orientation or positional relationship shown in the drawings, and is merely for the convenience of describing the present invention and simplifying the description, rather than indicating or implying that the device or element referred to must have a specific orientation, structure and operation in a specific orientation, which should not be construed as limitations on the present invention. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

In the description of this application, it should be noted that the terms "installation", "connected", and "connected" should be understood in a broad sense unless explicitly stated and limited otherwise. For example, it can be a fixed connection, a detachable connection, or an integral connection; it can also be a mechanical connection or an electrical connection; it can be a direct connection; or it can be an indirect connection through an intermediate medium; or it can be a communication between two components.

In the present invention, unless otherwise expressly stated and limited, the formation of a first feature over or under a second feature in the description that follows may include embodiments in which the first and second features are formed in direct contact, and may also include embodiments in which additional features may be formed between the first and second features, such that the first and second features may not be in direct contact. Moreover, the first feature "above", "over" and "on" the second feature includes the first feature directly above and above the second feature, or merely indicating that the first feature is at a level higher than the second feature. The first feature "below", "under" and "beneath" the second feature includes the first feature directly below and obliquely below the second feature, or merely the first feature has a level lower than the second feature.

The following disclosure provides many different embodiments or examples for implementing different structures of the present invention. In order to simplify the disclosure of the present invention, the components and arrangements of the specific examples are described below. Of course, they are merely examples and are not intended to limit the present invention. In addition, the present invention may repeat reference numerals and/or reference letters in the various embodiments, which are for the purpose of simplicity and clarity, and do not indicate the relationship between the various embodiments and/or arrangements discussed. Moreover, the present invention provides examples of various specific processes and materials, but one of ordinary skill in the art will recognize the use of other processes and/or the use of other materials.

The present invention proposes a novel polarizer structure, which can reduce the thickness of traditional polarizers, and achieve the effects of anti-reflection of the traditional polarizers and expansion of the viewing angle of the display screen.

FIG. 1 is a schematic diagram of a color filter structure 8 provided in this embodiment. The color filter structure 8 includes: a base layer 801; color filters disposed above the base layer 801, and including a red filter 802, a green filter 803, and a blue filter 804; a black matrix 805 disposed between the red filter 802, the green filter 803, and the blue filter 804, and having a height lower than the color filters; a protective film 806 disposed above the color filters and the black matrix; and a transparent conductive film 807 disposed above the protective film 806.

The red filter 802, the green filter 803, and the blue filter 804 are respectively provided with red nanoparticles 8021, green nanoparticles 8031, and blue nanoparticles 8041 therein; the color filter structure has a thickness less than or equal to 20 microns. Each of the red nanoparticles 8021, the green nanoparticles 8031, and the blue nanoparticles 8041 has a size between 5 nanometers and 100 nanometers. Each of the red nanoparticles 8021, the green nanoparticles 8031, and the blue nanoparticles 8041 includes a shape of a sphere, a cube, or a plate. The red nanoparticles 8021, the green nanoparticles 8031, and the blue nanoparticles 8041 are metal nanoparticles which include gold nanoparticles or silver nanoparticles.

The red nanoparticle 8021, the green nanoparticle 8031, and the blue nanoparticle 8041 doped in the color filter structure 8 will generate a plasmon effect when they are irradiated with visible light of a corresponding wavelength. When the red nanoparticles 8021, the green nanoparticles 8031, and the blue nanoparticles 8041 are irradiated with visible light, free electrons on the surface and visible light oscillate with each other to form surface waves, and electrons and holes excited by visible light absorbed by the red nanoparticles 8021, the green nanoparticles 8031 and the blue nanoparticles 8041 are distributed at opposite ends of the red nanoparticles 8021, the green nanoparticles 8031, and the blue nanoparticles 8041. At this time, the red nanoparticles 8021, the green nanoparticles 8031, and the blue nanoparticles 8041 may be equivalent to electric dipoles. The surface waves of the red nanoparticle 8021, the green nanoparticle 8031, and the blue nanoparticle 8041 are absorbed by the red nanoparticle 8021, the green nanoparticle 8031, and the blue nanoparticle 8041, and the remaining surface waves emit visible light in all directions in a coupling manner, resulting in stronger scattering.

Figure 2:
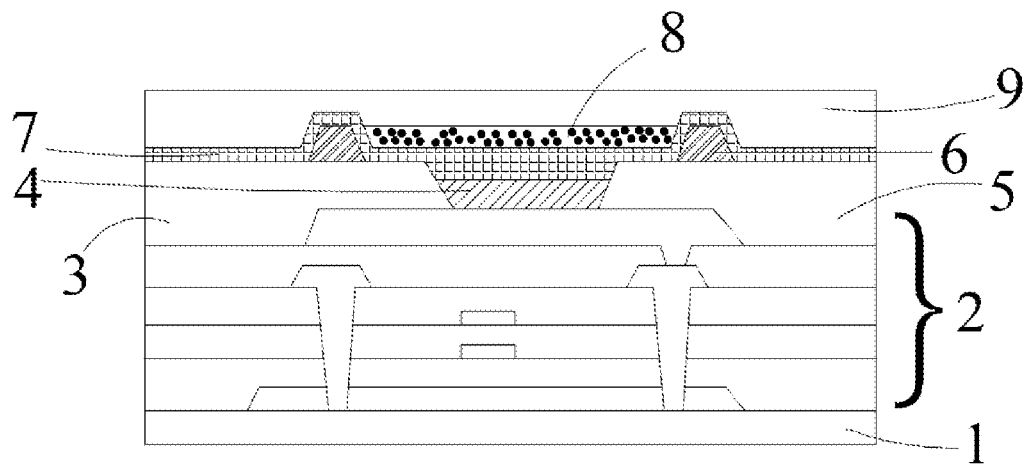
FIG. 2 is a schematic structural diagram of an OLED display panel provided an embodiment of the present invention.

FIG. 2 is a schematic structural diagram of an OLED display panel provided in this embodiment. As shown in FIG. 2, the OLED display panel includes a base substrate 1; a TFT structure 2 disposed above the base substrate 1; a color resistor retaining wall 3, a light-emitting layer 4, and a pixel definition layer 5, which are disposed on the TFT structure 2; a black retaining wall 6 disposed on the color resistor retaining wall 3 and the pixel definition layer 5; a cathode layer 7 covering the color resistor retaining wall 3, the black retaining wall 6, the light-emitting layer 4, and the pixel definition layer 5; a color filter structure 8 disposed on the cathode layer 7; and an encapsulation layer 9 covering the cathode layer 7 and color filter structure 8.

The color filter structure 8 is the color filter structure 8 provided in an embodiment of the present invention.

A height of the color filter structure 8 is slightly lower than or equal to a height of the black retaining wall 6.

For an OLED display panel, red, green and blue color filter structures 8 are respectively processed above the red, green and blue pixels, and the color filter structures 8 of corresponding colors are coated and formed on the cathode 7 corresponding to the red, green and blue pixels. The black retaining wall 6 around the pixels in the OLED display panel of this embodiment is higher than the other retaining walls in the OLED display panel. Therefore, the color filter structure 8 will be restricted by the black retaining wall 6.

The color filter structures 8 of different colors can absorb visible light of other wavelengths than their own colors, which will result in a decrease in the reflectivity of the display screen. By adjusting the thicknesses of the color filter structures 8 of different colors, the height of each of the color filter structures 8 is kept consistent. The thicknesses of the color filter structures 8 are between several micrometers and several ten micrometers, the height of the black retaining wall 6 is in the range of several micrometers to several ten micrometers, and the height of each of the color filter structures 8 is slightly lower than or equal to that of the black retaining wall 6, wherein the height of the black retaining wall 6 does not exceed 20 microns. Therefore, the black retaining wall 6 can effectively prevent crosstalk of the materials in the color filter structures 8 respectively corresponding to the pixels of different colors.

In this embodiment, in order to increase the display viewing angle of the OLED display panel, the color filter structure 8 provided in an embodiment of the present invention is used in the OLED display panel, that is, the color filter structures 8 of different colors is doped with nanoparticles having a plasmon effect in a corresponding color band. Sizes of the nanoparticles are between 5 nanometers and 100 nanometers. Moreover, each of the nanoparticles has a shape including, but is not limited to, a sphere, a cube, or a plate. The nanoparticles are metal nanoparticles, and the metal nanoparticles include, but are not limited to, gold nanoparticles or silver nanoparticles. When the nanoparticles doped in the color filter are irradiated with visible light of a corresponding wavelength, a plasmon effect is generated.

Figure 3:
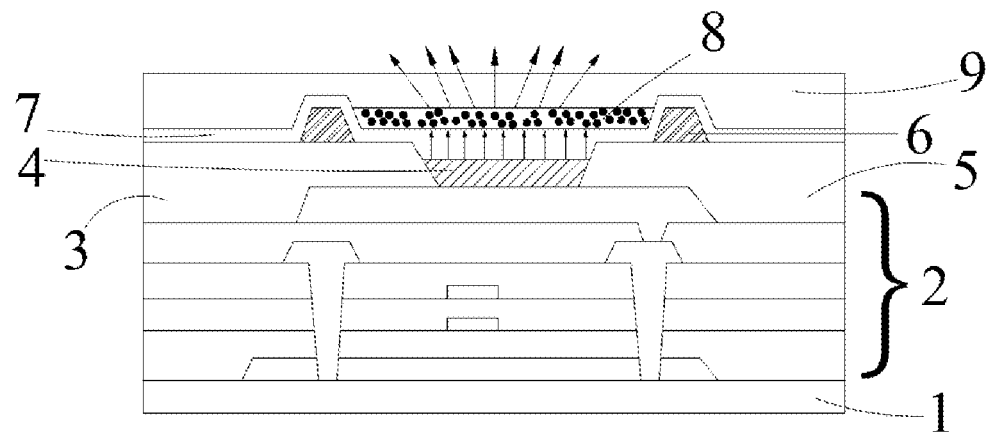
FIG. 3 is a schematic diagram of increasing a display viewing angle of an OLED display panel provided by an embodiment of the present invention.

As shown in FIG. 3, FIG. 3 is a schematic diagram of increasing a display viewing angle of an OLED display panel provided by an embodiment of the present invention. When the nanoparticles doped in the color filter structure 8 are irradiated with visible light emitted from the light-emitting layer 4, free electrons on the surface of the nanoparticles and visible light oscillate with each other to form surface waves, and electrons and holes excited by visible light absorbed by the nanoparticles, are distributed at opposite ends of the nanoparticles. At this time, the nanoparticles may be equivalent electric dipoles. The surface waves of the nanoparticles are absorbed by the nanoparticles, and the remaining surface waves emit visible light in all directions in a coupling manner, resulting in stronger scattering. Therefore, it is possible to achieve the absorption and scattering of visible light in the entire visible light band (380 nm to 780 nm) by doping nanoparticles of different sizes and shapes. That is, parameters such as the shapes, sizes, and materials of the nanoparticles in the color filter layer in embodiments of the present invention are different.

The color filter structure 8 corresponding to the red, green and blue pixels is doped with nanoparticles of corresponding color wavelengths. When the light emitted from the light-emitting layer 4 device reaches the color filter structure 8, it is scattered by the nanoparticles in the layer. Due to the randomness of the scattering direction, the emitted light of the light emitting layer 4 device is scattered into the entire space. In addition, since the thickness of the color filter structure 8 is equivalent to the height of the black retaining wall 6, the restriction of the viewing angle of the light-emitting layer 4 by the black retaining wall 6 is avoided, and the viewing angle of the OLED display panel is further expanded.

Figure 4:
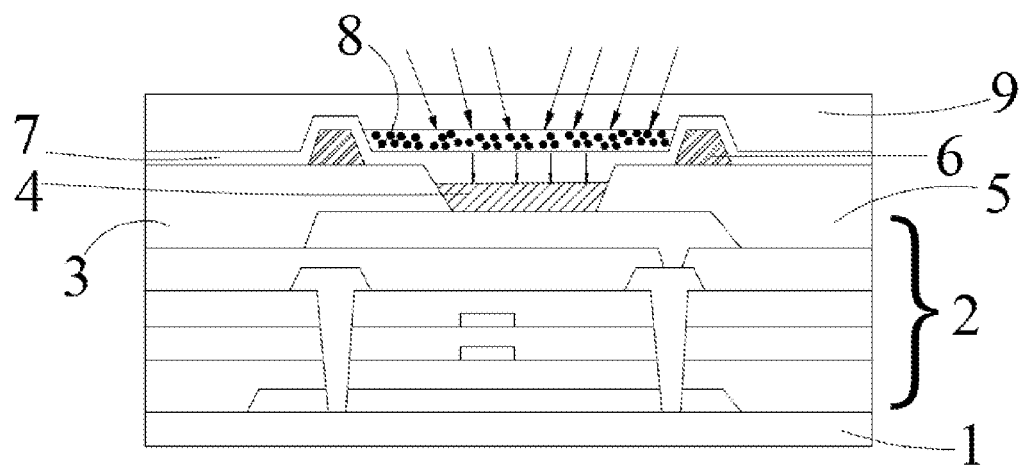
FIG. 4 is a schematic diagram of reducing a reflectivity of an OLED display panel provided in provided by an embodiment of the present invention.

As shown in FIG. 4, FIG. 4 is a schematic diagram of reducing a reflectivity of an OLED display panel provided in provided by an embodiment of the present invention. When external light irradiates a conventional OLED display panel, the corresponding red, green, and blue color filter layers only absorb visible light of other colors than their own colors, to reflect visible light of the corresponding red, green, and blue colors, such that the reflectance cannot be reduced to a very low level. When external light is irradiated to the OLED display panel provided in this embodiment, since the color filter structure 8 of the OLED display panel in this embodiment is doped with nanoparticles having plasmon effect, the nanoparticles will absorb and scatter visible light of the corresponding colors, so that the visible light corresponding to the pixel cannot be fully reflected by the cathode 7, and the OLED display panel provided in this embodiment has lower reflectivity compared to the conventional OLED display panel.

The color filter structure provided by the present invention is doped with nanoparticles, and after the light emitted from the light-emitting layer is scattered by the nanoparticles in the color filter, the light emitted from the light emitting layer can be scattered into the entire space due to the randomness of the scattering direction. The present invention also provides an OLED panel, which uses the color filter provided by the present invention, thereby reducing the thickness of traditional polarizers, and achieving the effects of anti-reflection of the traditional polarizers and expansion of the viewing angle of the display screen.

The color filter structure and the OLED display panel provided in the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application

What is claimed is:

1. An OLED display panel, comprising a base substrate, a TFT structure disposed above the base substrate, and a color resistor retaining wall, a light-emitting layer, a pixel definition layer, a black retaining wall, a cathode layer, a color filter structure, and an encapsulation layer which are disposed on the TFT structure, wherein the black retaining wall is disposed on the color resistor retaining wall and the pixel definition layer, the cathode layer covers the color resistor retaining wall, the black retaining wall, the light-emitting layer, and the pixel definition layer, the color filter structure is disposed on the cathode layer, and the encapsulation layer covers the cathode and the color filter structure;

wherein, the color filter structure comprises: a base layer; color filters disposed above the base layer, and comprising a red filter, a green filter, and a blue filter; a black matrix disposed between the red filter, the green filter, and the blue filter, and having a height lower than the color filter; a protective film disposed above the color filters and the black matrix; and a transparent conductive film disposed above the protective film; wherein the red filter, the green filter, and the blue filter are respectively provided with red nanoparticles, green nanoparticles and blue nanoparticles therein; and the color filter structure has a thickness less than or equal to 20 microns; and wherein a height of the color filter structure is slightly lower than or equal to a height of the black retaining wall.

2. The OLED display panel according to claim 1, wherein the color filters comprise a red filter, a green filter, and a blue filter respectively disposed on a red sub-pixel, a green sub-pixel, and a blue sub-pixel.

3. The OLED display panel according to claim 1, wherein a height of the black retaining wall is not more than 20 microns.

4. The OLED display panel according to claim 1, wherein shapes, sizes, and materials of the red nanoparticles, the green nanoparticles, and the blue nanoparticles in the color filters are different from each other.

5. The OLED display panel according to claim 1, wherein the red nanoparticles, the green nanoparticles, and the blue nanoparticles in the color filters are nanoparticles having an absorption wavelength of 380 nm to 780 nm.

* * * * *